(12) United States Patent
He

(10) Patent No.: US 7,313,192 B2
(45) Date of Patent: Dec. 25, 2007

(54) METHOD AND APPARATUS FOR A COMPLEMENTARY ENCODER/DECODER

(75) Inventor: Allen He, Fremont, CA (US)

(73) Assignee: NXP B.V., Eindhoven (NL)

( * ) Notice: Subject to any disclaimer, the term of this patent is extended or adjusted under 35 U.S.C. 154(b) by 627 days.

(21) Appl. No.: 09/871,274

(22) Filed: May 31, 2001

(65) Prior Publication Data
US 2003/0058954 A1 Mar. 27, 2003

(51) Int. Cl.
H04L 23/02 (2006.01)
(52) U.S. Cl. .................................................. 375/265
(58) Field of Classification Search .............. 375/265, 375/341; 714/786, 792
See application file for complete search history.

(56) References Cited

U.S. PATENT DOCUMENTS

| | | | | |
|---|---|---|---|---|
| 5,115,453 A * | 5/1992 | Calderbank et al. | ........ | 375/265 |
| 6,269,129 B1 * | 7/2001 | Rhee et al. | .................. | 375/341 |
| 6,298,463 B1 * | 10/2001 | Bingeman et al. | .......... | 714/786 |
| 6,771,705 B2 * | 8/2004 | Kenney et al. | ............. | 375/267 |

OTHER PUBLICATIONS

ETSI: "Digital Video Broadcasting (DVB); Framing structure, channel coding and modulation for 11/12 GHz satellite services" EN 300 421, Aug. 1997, pp. 1-24, XP002218736 paragraph '4.4.11; figure 1.
Brabulescu S A et al: "Turbo codes: a tutorial on a new class of powerful error correcting coding schemes, Part 1 & Part 2" http://www.sworld.com.au, Oct. 26, 1998, XP002215242 p. 1, line 1-p. 48, last line: figures 2.2, 2.3, 3.3.
TR45, Introduction to cdma2000 Standards for Spread Spectrum Systems, PN-4693 (to be published as TIA/EIA/IS-2000.2-A), Ballot Resolution Version, pp. 2-97-2-103 (Mar. 2000).

* cited by examiner

Primary Examiner—Kevin Kim

(57) ABSTRACT

A method and apparatus for encoding and decoding a bit stream by the use of a code word that comprises ones and zeros. The encoder is achieved by altering the bit stream such that the altered bit stream comprises a different combination of ones and zeros. The altered bit stream and the original bit stream are then encoded, transmitted, and decoded. The decoder accounts for the differing bit streams by reversing the effect of the altering.

21 Claims, 4 Drawing Sheets

METHOD AND APPARATUS FOR A COMPLEMENTARY ENCODER/DECODER

TECHNICAL FIELD

The invention relates generally to communications systems and, more particularly, to a method and an apparatus for encoding and/or decoding a bit message.

BACKGROUND

Digital networks generally involve the modulation of a bit stream on a transmitted signal. While providing for increased efficiencies, digital networks remain susceptible to noise, such as noise from buildings, trees, cars, electrical sources, magnetic sources, and the like. Typically, digital messages are encoded prior to modulation and transmission, and decoded upon reception and de-modulation. The encoded digital messages are generally grouped into one or more bits forming a symbol. The symbol is used to select a high frequency sinusoidal electromagnetic (EM) wave that has been identified as representing the symbol. The technique generally used to transmit a symbol by a high frequency sinusoidal wave is to alter the wave's amplitude, frequency, and/or phase in a designated manner. Therefore, a wave comprising of a predetermined amplitude, frequency, and/or phase represents a symbol, i.e., a predetermined bit pattern.

By transmitting digital messages in such a manner, it is possible to recover from some errors caused by noise in the transmission. The recovery of errors, however, is dependent upon an essentially random distribution of zeros and ones. Unfortunately, if a message comprises a substantial number of zeros, encoders and decoders generally provide poor results. Furthermore, a sequence of the same symbols in the transmission may fail other error correcting function loops, such as a synchronization loop, an auto-gain control loop, and the like, since the function loops may need the differential information of the previously and the next received symbols to function properly.

Therefore, there is a need for a method and an apparatus for transmitting a digital message comprising a substantial number of zeros.

SUMMARY

The present invention provides a method and an apparatus for encoding and/or decoding a bit stream such that the encoded bit stream comprises zeros and ones. The encoding is accomplished by providing as input to a plurality of encoders differing versions, i.e., containing a different sequence of corresponding bit values, of the bit stream. Similarly, the decoding is accomplished by accounting for the differing versions in the input to the decoder.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, it will be obvious to those skilled in the art that the present invention may be practiced without such specific details. In other instances, well-known elements have been illustrated in schematic or block diagram form in order not to obscure the present invention in unnecessary detail. Additionally, for the most part, details concerning telecommunications and the like have been omitted inasmuch as such details are not considered necessary to obtain a complete understanding of the present invention, and are considered to be within the skills of persons of ordinary skill in the relevant art.

It is further noted that, unless indicated otherwise, all functions described herein may be performed in either hardware or software, or some combination thereof. In a preferred embodiment, however, the functions are performed by a processor such as a computer or an electronic data processor in accordance with code such as computer program code, software, and/or integrated circuits that are coded to perform such functions, unless indicated otherwise.

The principles of the present invention and their advantages are best understood by referring to the illustrated embodiment depicted in FIGS. 1-5.

Figure 1:
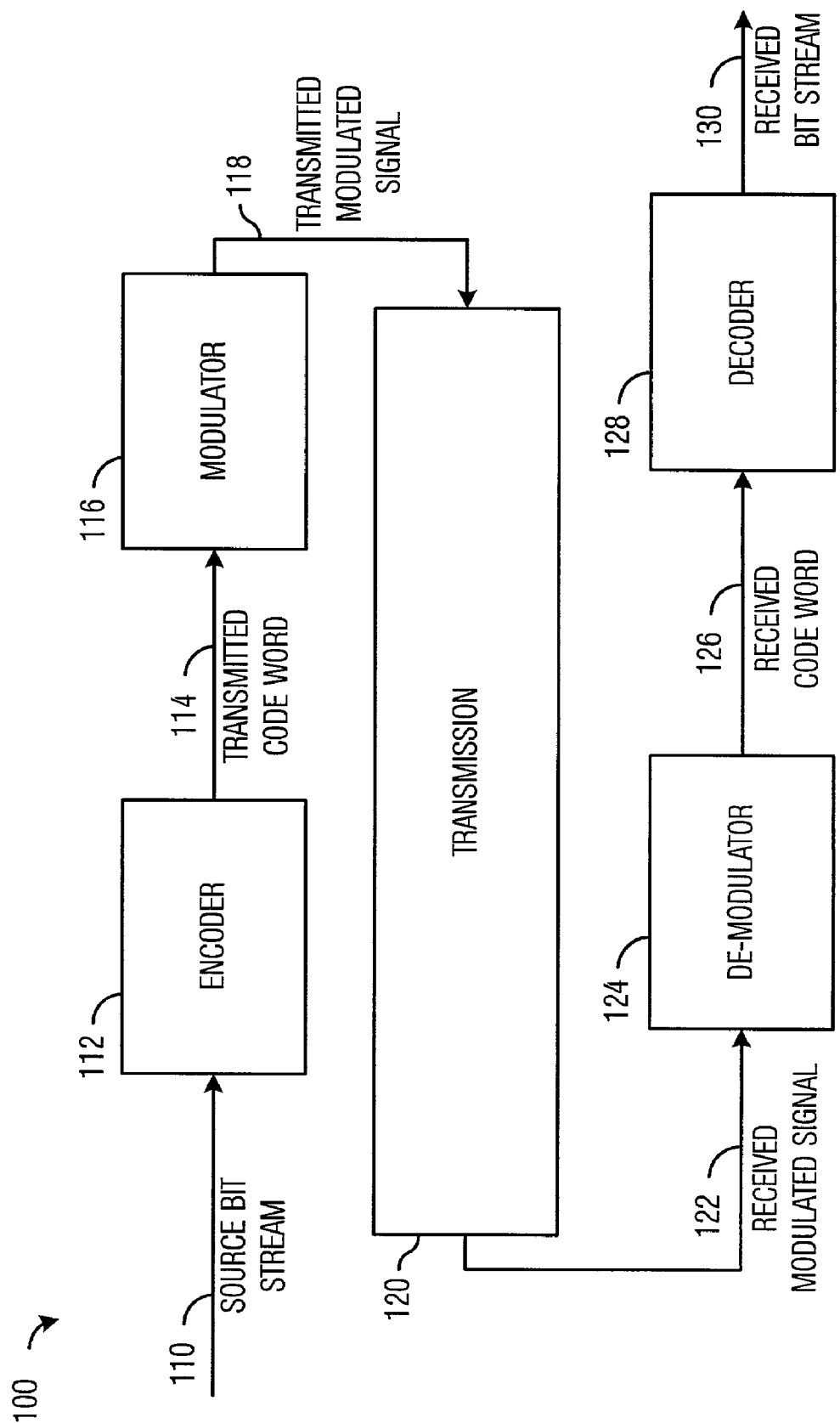
FIG. 1 is a diagram of a network environment that embodies features of the present invention.

Referring to FIG. 1 of the drawings, the reference numeral 100 generally designates a portion of a communications network which embodies features of the present invention. Specifically, the communications portion 100 comprises an encoder 112 configured to accept a source bit stream 110 and to provide a transmitted code word 114 to a modulator 116. The source bit stream is generally organized into one or more frames, each frame comprising one or more bits. Typically, the source bit stream is organized into frames of hundreds or thousands of bits.

The modulator 116 is a digital modulator, such as a Quadrature Amplitude Modulator (QAM), Pulse Amplitude Modulation (PAM), Pulse Code Modulation (PCM), Differential Pulse-Code Modulation (DPCM), Phase-Shift Keying (PSK), Differential Phase-Shift Keying (DPSK), Offset Quadrature Phase-Shift Keying (OQPSK), Differential Quadrature Phase-Shift Keying ($\pi$/4-QPSK), Gaussian Filtered Minimum Shift Keying (GMSK), and the like, configured to convert the transmitted code word 114 into a transmitted modulated signal 118 that may be transmitted, as indicated by a transmission function 120.

The transmission function 120 is configured to provide the transmission of the transmitted modulated signal 118, via wireless or wireline technologies, resulting in the reception of a modulated signal 122. The transmission of signals via wireless or wireline technologies is well known to a person skilled in the art and, therefore, will not be discussed in greater detail, except insofar as is necessary to describe the present invention.

The received modulated signal 122 is provided to a demodulator 124 configured for converting the received modulator signal 122 into a received code word 126. The received code word 126 is provided as input to a decoder 128 configured for converting the received code word 118 into a received bit stream 130.

The encoder 120 and/or the decoder 128 may comprise of a stand-alone apparatus, an apparatus comprising an encoder and/or decoder, such as a transmitter, a receiver, a mobile phone, and the like, or a module for an apparatus, such as a component of a transmitter, a receiver, a mobile phone, and the like. As such, the present invention should be construed to include apparatuses that are stand-alone encoders and/or decoders, apparatuses that comprise encoders and/or decoders, and modules comprising encoders and/or decoders.

It should be noted that noise in the transmission function 120 of the transmitted modulated signal 118 may prevent the reception of the received modulated signal 122 that is identical to the transmitted modulated signal 118. As a result, the demodulated signal, i.e., the received code word 126, may differ from the transmitted code word 114. It is therefore preferred that the encoder 112 and the decoder 128 be configured to utilize a mechanism to help reduce the effect of noise and to assist in error recovery. One such mechanism that is particularly useful and commonly used in the industry is a turbo encoder/decoder utilizing a Recursive Systematic Convolutional (RSC) encoding technique. While the remaining discussion assumes, and provides examples for, the use of the RSC turbo encoder and decoder, the RSC turbo encoder and decoder are used for exemplary purposes only, and the present invention should not be limited to the use of the RSC turbo encoder and decoder. While other coding techniques, such as a Hamming code, a Golay code, a Reed-Muller code, a Bose, Chaudhuri and Hocquenghem (BCH) code, a Reed-Solomon code, a Fire code, a convolutional code, and the like, may be used with the present invention, studies have shown that turbo encoders comprising an RSC encoding technique generally outperforms other varieties, and, therefore, is the preferred method. The use and operation of alternative encoder/decoder methods will be obvious to a person of ordinary skill in the art upon a reading of the present invention, and, accordingly, is to be included within the scope of the present invention.

Figure 2:
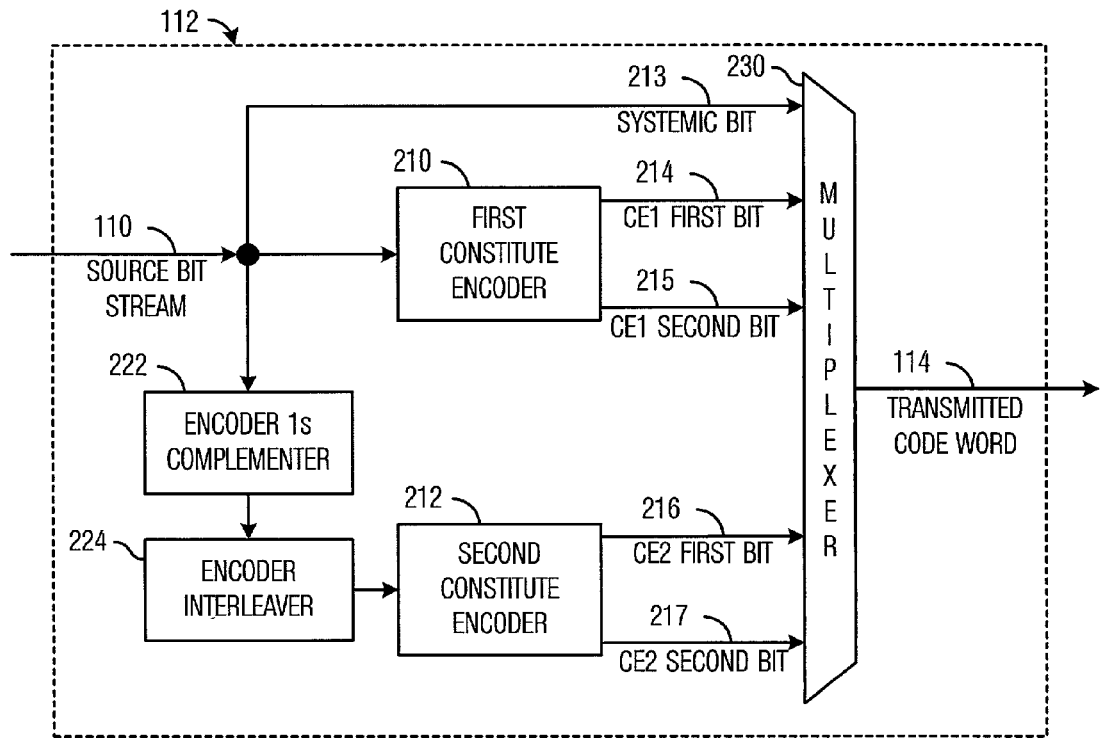
FIG. 2 is a block diagram illustrating one embodiment of the present invention in which a ones complementer is applied to a bit stream before encoding.

FIG. 2 exemplifies one embodiment of the encoder 112 (FIG. 1) that embodies features of the present invention, namely, a ⅕ rate turbo encoder, i.e., every one input bit produces 5 output bits. While as mentioned above other encoders may be used in conjunction with the present invention, a turbo encoder is illustrated for the sake of conciseness.

The encoder 112 generally comprises multiplexing a systemic bit to two bits from each of two or more constitute encoders, which preferably utilize a Recursive Systematic Convolutional (RSC) encoding technique. Specifically, the encoder 112 is configured to comprise a first constitute encoder 210 and a second constitute encoder 212, each of which are explained in more detail below with reference to FIG. 3.

The first constitute encoder 210 preferably accepts as input the source bit stream 110 (FIG. 1). Generally, the first constitute encoder 210 accepts a bit stream and outputs two bits, i.e., a first constitute encoder (CE1) first bit 214 and a CE1 second bit 215, also known as parity bits, for each bit in the source bit stream 110.

The second constitute encoder 212 preferably accepts the source bit stream 110 that has been modified in order to prevent the first constitute encoder 210 and the second constitute encoder 212 from generating the same result, and to provide additional protection from noise. Preferably, the second constitute encoder 212 is configured to accept as input the source bit stream 110 after the source bit stream 110 has been encoded by an encoder ones complementer 222 and interleaved (i.e., the order of the source bit stream 110 is essentially randomized) by an encoder interleaver 224, and to provide as output a second constitute encoder (CE2) first bit 216 and a CE2 second bit 217.

The encoder ones complementer 222 is configured to perform a ones complement function, i.e., changing ones to zeros and zeros to ones. As can be seen below with reference to FIG. 3, the second constitute encoder 212 requires an input of one or more ones to generate a non-zero output. The encoder ones complementer 222 acts to insert ones into the transmitted code word 114 in a substantially random manner, thereby restricting the transmission of substantially all zeros, which is difficult to recover from noise-induced decoding errors. As exemplified below, an all-zeros bit stream is converted to a transmitted code word 114 comprising ones and zeros.

As mentioned above, the encoder ones complementer 222 may be replaced with another function that alters the bit stream such that the corresponding bit values are different, such as a differential encoder (the output is equal to the inverse of the exclusive or of the current bit and the previous bit). The purpose of the ones complementer 222, and the differential encoder, is to provide two different versions of the bit stream to at least two encoders. Any function providing this feature may be utilized. It should also be noted, however, that a corresponding modification must be made to the decoder 128.

The encoder interleaver 224 is configured to essentially randomize the order of the source bit stream 110 within each frame to reduce the effect of burst errors in the transmission. Generally, noise in a transmission affects a series of contiguous bits, i.e., burst errors, which are typically more difficult to recover from than corrupted, non-contiguous bits. The encoder interleaver 224 recognizes this phenomenon and attempts to dissipate the effect of noise by altering the order of the bits such that a burst error corrupting contiguous bits will be dissipated to non-contiguous bits when the bits are reordered upon reception, which will be discussed below with reference to FIG. 5.

By way of example of the foregoing, in a block of 6 bits having bits 0, 1, 2, 3, 4, and 5 in sequential order, the encoder interleaver 224 may reorder the bits to be transmitted in the order 2, 5, 3, 1, and 4. A burst error corrupting two contiguous bits, such as 5 and 3, are reordered to their original bit positions upon reception, thereby dissipating the burst error to non-contiguous bits, limiting the effect of noise to non-contiguous bits and increasing the probability of recovering the corrupted bits. The design of the encoder interleaver 224 is dependent upon, among other things, the block size of the data and the anticipated signal-to-noise. The use and design of an interleaver is well known to a person of ordinary skill in the art, and therefore, will not be discussed in greater detail herein, except insofar as is necessary to describe the present invention.

A multiplexer 230 is configured to accept as input a systemic bit 213, which is the original, unmodified bit from the source bit stream 110, the CE1 first bit 214, the CE1 second bit 214, the CE2 first bit 215, and the CE2 second bit 216, and output the transmitted code word 114. The bits are preferably multiplexed using a straight bit-wise concatenation algorithm or a puncturing algorithm. The bit-wise concatenation algorithm concatenates sequentially the systemic bit 213, the CE1 first bit 214, the CE1 second bit 215, the CE2 first bit 216, and the CE2 second bit 217, for each bit in the input bit stream.

Alternatively, a puncturing algorithm may be used to gain additional efficiencies by reducing the number of bits in the codeword 114. Puncturing is well known to a person of ordinary skill in the art and, therefore, will not be discussed in greater detail, except insofar as is necessary to disclose the present invention.

As will be appreciated by one skilled in the art upon a reading of the present invention, the encoder 112 is provided by way of example only and is not to be construed to limit the invention in any manner. For instance, additional constitute encoders may be used to provide additional data recovery, the encoder ones complementer may be implemented elsewhere, such as in conjunction with the first constitute encoder 210, the positioning of the encoder ones complementer 222 and the encoder interleaver 224 may be reversed, and the like. It should be noted, however, that making such modifications will require similar modifications to the decoder illustrated in FIG. 5, the modifications of which will be obvious to a person skilled in the art upon a reading of the present invention.

Figure 3:
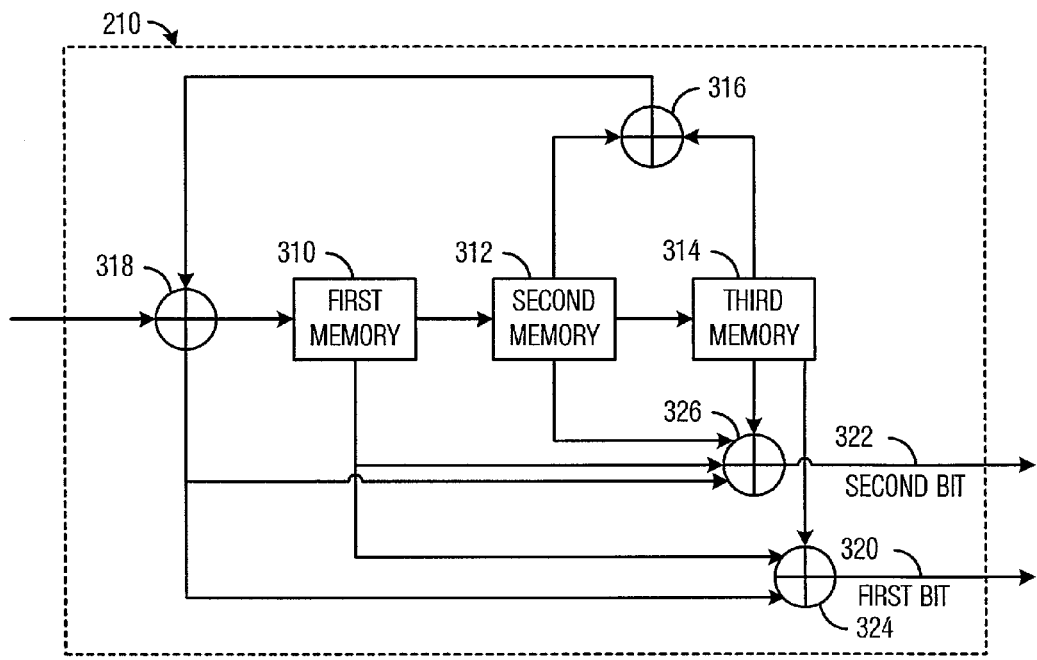
FIG. 3 is a block diagram illustrating one embodiment of the present invention in which a bit stream is encoded using a Recursive Systemic Convolutional encoder.

FIG. 3 illustrates one method of performing the first constitute encoder 210 discussed above with reference to FIG. 2. The first constitute encoder 210 may also be used for the second constitute encoder 212 of FIG. 2.

Preferably, the first constitute encoder 210 comprises an RSC encoder with a memory of 3, as illustrated. The RSC encoder is illustrated for exemplary purposes only and is not to be construed as limiting the present invention in any manner. It will be obvious to one skilled in the art upon a reading of the present invention that other designs of recursive or non-recursive, convolutional or block encoders are available and may be used in conjunction with the present invention, and, therefore, are to be included within the scope of the present invention.

Generally, the first constitute encoder 210 is configured with three memories, namely, a first memory 310, a second memory 312, and a third memory 314, also referred to as delays and/or shift registers. The first constitute encoder 210 is also configured to provide a recursive aspect to the encoding by applying the result of an exclusive or 316 of the value of the second memory 312 and the value of the third memory 314 to an exclusive or 318 with the input bit.

The output of the first constitute encoder 210 comprises a first bit 320, such as the CE1 first bit 214 and/or the CE2 first bit 216, and a second bit 322, such as the CE1 second bit 215 and/or the CE2 second bit 217. The first bit 320 is preferably the result of the exclusive or 326 of the result of the exclusive or 318, the first memory 310 and the third memory 314, and the second bit 322 is preferably the result of an exclusive or 324 of the result of the exclusive or 318, the first memory 310, the second memory 312, and the third memory 314.

Figure 4:
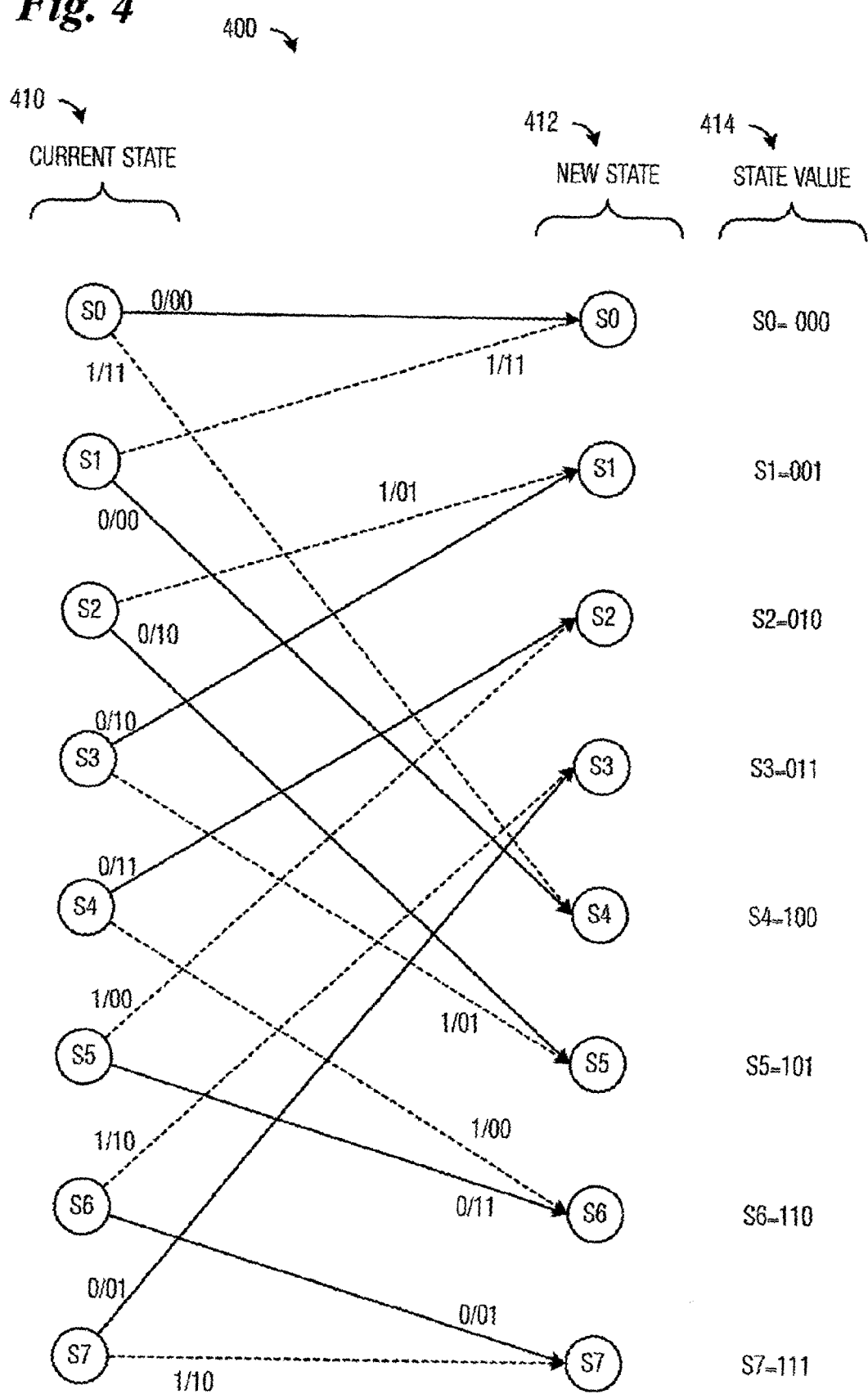
FIG. 4 is a Trellis diagram illustrating the state transitions of the encoder illustrated in FIG. 3.

FIG. 4 is a Trellis diagram representation of the RSC encoding technique illustrated by the first constitute encoder 210 (FIG. 3) and is provided to further the understanding of the RSC encoding technique illustrated in the first constitute encoder 210 (FIG. 3). The Trellis diagram 400 represents a state diagram that illustrates the transition from a current state 410 to a new state 412. Associated with each state "S0"-"S7" is a state value 414 comprising a three bit value that represents a state of the first memory 310, the second memory 320, and the third memory 314, respectively. Each possible transition is indicated by either a solid line or a dotted line. The dotted lines represent transitions from the current state 410 to the new state 412 as a result of the input bit being a "1," as illustrated by a "1" before the forward slash in the line label, and the solid lines represent transitions from the current state 410 to the new state 412 as a result of the input bit being a "0," as illustrated by a "0" before the forward slash in the line label.

Each line label also comprises two bits following the forward slash. The first bit represents the first bit from a constitute encoder, such as the CE1 first bit 214 and/or the CE2 first bit 216 of FIG. 2. The second bit represents the second bit from a constitute encoder, such as the CE1 second bit 215 and/or the CE2 second bit 217 of FIG. 2.

For example, if the current state 410 is "S0," then the first memory 310, the second memory 312, and the third memory 314 each contain a "0," as illustrated by the state value 414 of "S0=000." If, while in the current state 410 of "S0," the input bit is a "0," then the output of the first bit and the second bit of the first constitute encoder 210 are each "0," as indicated by the solid line between the current state 410 of "S0" and the new state 412 of "S0." Note that the line is labeled "0/00" because the input bit is a "0" and the output of the first and second bit of the RSC encoder were each "0." Upon transitioning into the new state 412 of "S0," the value of the first memory 310, the second memory 312, and the third memory 314 is "000," respectively, as indicated by the state value "S0=000."

If, however, while in the current state 410 of "S0," the systemic bit is a "1," then the output of the first bit 320 and the second bit 322 of the first constitute encoder 210 are each "1," as indicated by the dotted line between the current state 410 of "S0" and the new state 412 of "S4." Note that the line is labeled "1/11" because the input bit is a "1" and the output of the first bit 320 and the second bit 322 of the first constitute encoder 210 were each "1." Upon transitioning into the new state 412 of "S4," the value of the first memory 310, the second memory 320, and the third memory 314 is "100," respectively, as indicated by the state value "S4=100."

Figure 5:
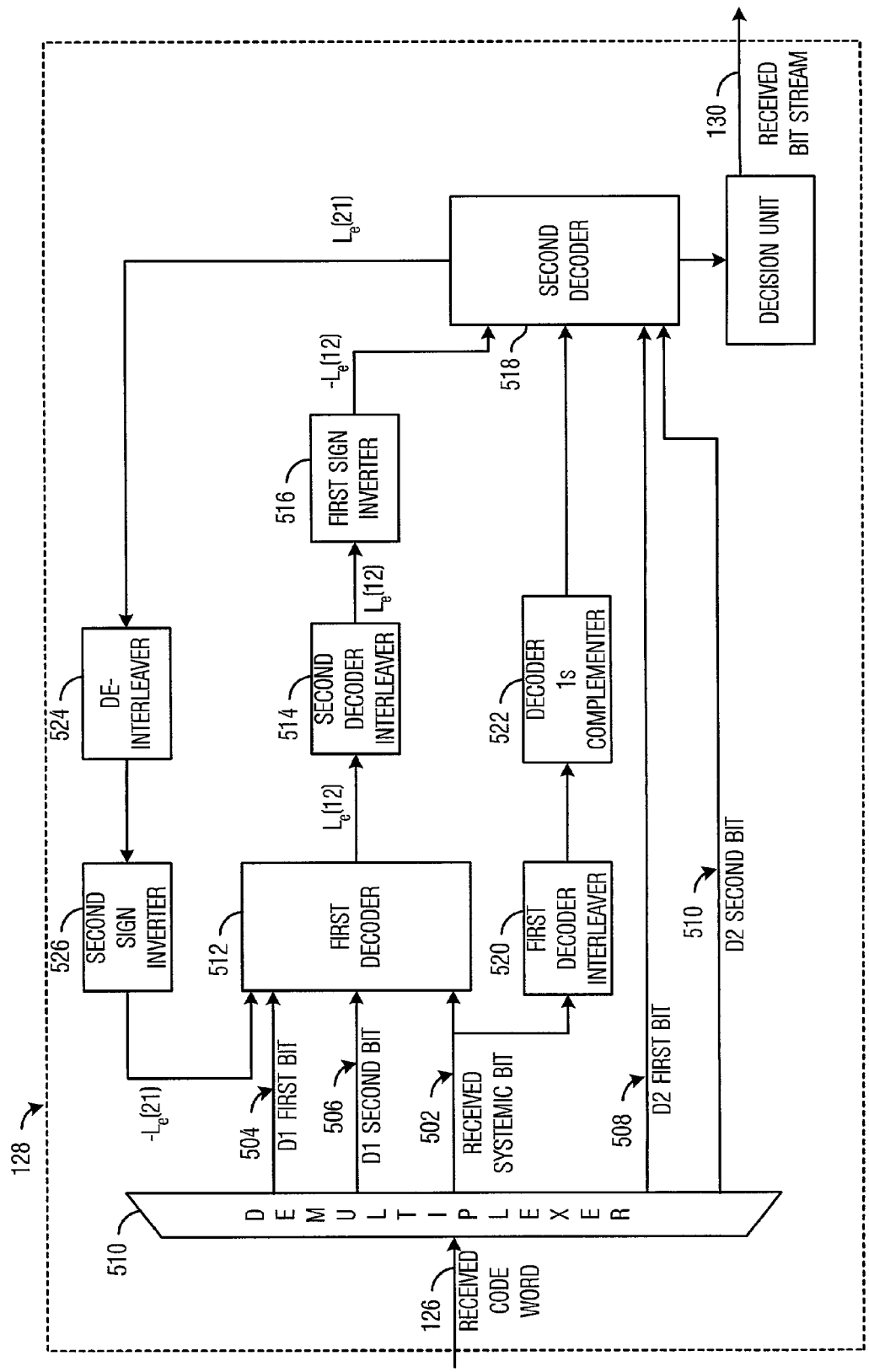
FIG. 5 is a block diagram illustrating one embodiment of the present invention in which a bit stream is decoded.

FIG. 5 illustrates one method of performing the decoder 128 discussed above with reference to FIG. 1. Preferably, the decoder 128 comprises a turbo decoder as illustrated in FIG. 5. Specifically, reference numeral 128 is a turbo decoder that may be used to decode the received code word 126 as encoded by the turbo encoder as described in FIGS. 2-4. The turbo decoder, which is based on the Maximum A-Posteriori Probability (MAP) algorithm, is illustrated for exemplary purposes only and is not to be construed as limiting the present invention in any manner. It will be obvious to one skilled in the art upon a reading of the present invention that other designs of decoders, such as log-MAP, Max-log-MAP, Soft Output Viterbi Algorithm (SOVA), and the like, may be utilized, and, therefore, are to be included within the scope of the present invention.

Generally, as will be discussed in greater detail below, the decoder 128 comprises a first decoder 512 and a second decoder 518 operating serially in an interative manner. The output of the first decoder 512, i.e., $L_e$ (12), is one of the inputs to the second decoder 518, and the output of the second decoder 518, i.e., $L_e$ (21), is one of the inputs of the first decoder 512. The first decoder 512 is responsible for decoding the bits encoded by the first constitute encoder 210 (FIG. 2), and the second decoder 518 is responsible for decoding the bits encoded by the second constitute encoder 212 (FIG. 2).

The decoder 128 comprises a demultiplexer 510 configured to demultiplex the received code word 126 (FIG. 1) into five bits, namely, a received systemic bit 502, a received first decoder (D1) first bit 504, a received D1 second bit 506, a received second decoder (D2) first bit 508, and a received D2 second bit 510, which correspond to the systemic bit 213, the CE1 first bit 214, the CE1 second bit 215, the CE2 first bit 216, and the CE2 second bit 217, respectively.

The first decoder 512 is configured to accept the received systemic bit 502, the D1 first bit 504, and the D1 second bit 506 as input. In addition to the three inputs listed above, the first decoder 512 is also configured to receive as input a natural log of the likelihood that the received systemic bit 502 is a one ($-L_e$ (21)), where the notation of "(21)" indicates that the values are the results of the second decoder that are sent to the first decoder, and, similarly, "(12)" indicates that the values are the results of the first decoder that are sent to the second decoder. The ($-L_e$ (21)) is initialized to zero and will be discussed in more detail below with reference to a sign inverter 526.

The first decoder 512 may be any decoding algorithm that provides satisfactory results for the type of encoder chosen. For instance, suitable decoding techniques for the turbo encoder illustrated in FIGS. 2-4 are the MAP, SOVA, log-MAP, Max-log-MAP, and the like. The decoding techniques are well known to a person of ordinary skill in the art, and the interaction of the decoding technique with the present invention will be obvious to a person of ordinary skill in the art upon a reading of the present invention.

The first decoder 512 preferably provides output in the form of the natural log of the likelihood that a particular bit is a 1. Specifically, the output of the first decoder 512 is given by the following formula:

$$L_e(12) = \log e\left(\frac{p[receivedsystemicbit = 1]}{p[receivedsystemicbit = 0]}\right),$$

where:
p[received systemic bit=1] is the probability that the received systemic bit 502 is equal to a 1; and
p[received systemic bit=0] is the probability that the received systemic bit 502 is equal to a 0.

Therefore, $L_e$ (12) will be positive if there is a higher probability that the received systemic bit 502 is a one and will be negative if there is a higher probability that the received systemic bit is a zero.

As-mentioned above, the output values of the first decoder 512 are input to the second decoder 518. The values, however, must be adjusted to account for the encoder ones complementer 222 (FIG. 2) and the encoder interleaver 224 (FIG. 2). As illustrated in FIG. 2, the first constitute encoder 210 received as input bits that were neither interleaved nor inverted, i.e., ones complement. The second encoder 212, however, received as input bits that were reorder by the encoder interleaver 224 and inverted by the encoder ones complementer 222.

Therefore, referring now back to FIG. 5, the output of the first decoder 512 must be reordered by a first decoder interleaver 514 and sign inverted by a sign inverter 516. The result of the first decoder interleaver 514 and the sign inverter 516 is the probability that the received systemic bit 502 is a zero ordered in the same manner as the D2 first bit 508 and the D2 second bit 510.

Similarly, the received systemic bit 502 must be adjusted to provide the bits in the same order and the same inverted representation as used to generate the D2 first bit 508 and the D2 second bit 510, i.e., duplicate the input to the second constitute encoder 212 (FIG. 2). As a result, a second decoder interleaver 520 and a decoder ones complementer 522 is applied to the received systemic bit 502.

Therefore, the input to the second decoder 518 comprises the ($-L_e$ (12)), the received systemic bit 502 reordered and bit interverted, the D2 first bit 508, and the D2 second bit 510. The operation of the second decoder 518 is as described above with reference to the first decoder 512.

The second decoder 518 preferably provides output in the form of the natural log of the likelihood that a particular bit is a 1. Note that due to the ones complement function, a high probability result from the second decoder 518 that a bit is a 1 is actually a high probability result that the bit is a 0. Specifically, the output of the second decoder 518 is given by the following formula:

$$L_e(21) = \log e\left(\frac{p[invertedreceivedsystemicbit = 1]}{p[invertedreceivedsystemicbit = 0]}\right),$$

where:
p[inverted received systemic bit=1] is the probability that the received systemic bit 502 after application of the decoder ones complement 522 is equal to a 1, i.e., actually a 0; and
p[inverted received systemic bit=0] is the probability that the received systemic bit 502 after application of the decoder ones complement 522 is equal to a 0, i.e., actually a 1.

Therefore, $L_e$ (21) will be positive if there is a higher probability that the received systemic bit 502 is a zero and will be negative if there is a higher probability that the received systemic bit is a one.

As mentioned above, the output of the second decoder 518 is used as input to the first decoder 512. Similar to $L_e$ (12), however, the output $L_e$ (21) must be adjusted to account for the ones complement and interleaving functions. Therefore, a de-interleaver 524 and a second sign inverter 526 is applied to the output of the second decoder 518 prior to being used as input to the first decoder 512.

The turbo decoder process described above is preferably performed on the block of received bits for one or more iterations as determined by a decision unit 528. Preferably, the process is performed eight iterations. Alternatively, the decision unit 528 may be configured to vary the number of iterations based upon, among other things, the probabilities, the variance between iterations, and the like. Upon determining that the number of iterations is sufficient, the decoder 128 outputs the received bit stream 130 (FIG. 1).

It should also be noted that the decoder ones complementer 522 may be replaced with a differential encoder if a differential encoder is used in place of the encoder ones complementer 222 (FIG. 2) as mentioned above.

By way of example, suppose the source bit stream 110 comprises a stream of 42 zeros. The output of the encoder 112, assuming the absence of the encoder interleaver 224, is illustrated in the following table. The first row represents the transmitted code word, which comprises, in order, the systemic bit 213, the CE1 first bit 214, the CE1 second bit 215, the CE2 first bit 216, and the CE2 second bit 217. The second row represents the value of the systemic bit, which is always zero in this example.

The third row represents the output of the first constitute encoder 210 and, in parenthesis, the state transitions as illustrated in FIG. 4. Note that the first constitute encoder 210 outputs all zeros when the value of the systemic bit is zero and that the state transition is always from state "S0" to state "S0."

The fourth row represents the output of the second encoder 212 and, in parenthesis, the state transitions as illustrated in FIG. 4. Note that, due to the ones complement, the output is not always zeros. An input stream of 42 zeros will repeat this pattern six times.

| Transmitted Code Word | 00011 | 00000 | 00010 | 00001 | 00000 | 00001 | 00011 |
|---|---|---|---|---|---|---|---|
| Systemic bit | 0 | 0 | 0 | 0 | 0 | 0 | 0 |
| First Encoder | 00 (S0 to S0) | 00 (S0 to S0) | 00 (S0 to S0) | 00 (S0 to S0) | 00 (S0 to S0) | 00 (S0 to S0) | 00 (S0 to S0) |
| Second Encoder | 11 (S0 to S4) | 00 (S4 to S6) | 10 (S6 to S3) | 01 (S3 to S5) | 00 (S5 to S2) | 01 (S2 to S1) | 11 (S1 to S0) |

Therefore, if the modulator 116 (FIG. 1) that transmits 5 bits in each cycle, a zero will be assigned 4 different values, namely, 0, 1, 2, and 3. Additional variations may be obtained by choosing a modulator 116 that transmits a different number of bits than the rate of the encoder (1/5 for this example), such as the 64 QAM, which transmits 6 bits per pulse.

For example, the following string comprises the above bit pattern concatenated together and divided into 6-bit blocks, as would be the case if a 1/5 rate turbo encoder were used in conjunction with 64 QAM.

```
000110 | 000000 | 010000 | 010000 | 000001
000110 | 001100 | 000000 | 100000 | 100000
000010 | 001100 | 011000 | 000001 | 000001
000000 | 000100 | 011000 | 110000 | 000010
000010 | 000000 | 001000 | 110001 | 100000
000100 | 000100 | 000000 | 010001 | 100011
000000 | 001000 | 001000 | 000000 | 100011
```

For ease of comparison, the following digital string replaces the binary string with their decimal equivalent.

```
6 |  0 | 16 | 16 |  1
6 | 12 |  0 | 32 | 32
2 | 12 | 24 |  1 |  1
0 |  4 | 24 | 48 |  2
2 |  0 |  8 | 49 | 32
4 |  4 |  0 | 17 | 35
0 |  8 |  8 |  0 | 35
```

Therefore, the use of the ones complement encoder/decoder enclosed in the present invention results in the use of 14 different symbols, i.e., pulses, in a system utilizing 64 QAM, namely, 0, 1, 2, 4, 6, 8, 12, 16, 17, 24, 32, 35, 48, and 49.

It is understood that the present invention can take many forms and embodiments. Accordingly, several variations may be made in the foregoing without departing from the spirit or the scope of the invention. For example, different encoding schemes may be utilized that provide different versions of the bit stream to a plurality of encoders.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of preferred embodiments. Accordingly, it is appropriate that the appended claims be construed broadly and in a manner consistent with the scope of the invention.

The invention claimed is:

1. An encoder for encoding a first bit stream, comprising:
    means for generating a second bit stream from the first bit stream, the second bit stream having one or more different corresponding bit values than the first bit stream;
    means for generating a first encoder first bit and a first encoder second bit for each bit in the first bit stream; and
    means for generating a second encoder first bit and a second encoder second bit for each bit in the second bit stream, wherein the means for generating a second bit stream comprises at least one of a ones complementer and a differential encoder.

2. An encoder for encoding a first bit stream, comprising:
    means for generating a first encoder first bit and a first encoder second bit far each bit in the first bit stream;
    means for generating a second bit stream from the first bit stream, the second bit stream having one or more different corresponding bit values than the first bit steam;
    means for generating a second encoder first bit and a second encoder second bit for each bit in the second bit stream; and
    means for multiplexing the first bit stream, the first encoder first bit, the first encoder second bit, the second encoder first bit, and the second encoder second bit, wherein the means for generating a first encoder first bit and a first encoder second bit comprises a constitute encoder.

3. A method for encoding a first bit stream, comprising:
    receiving the first bit stream;
    encoding the first bit stream with a first encoder to generate a first encoder first bit and a first encoder second bit for each bit in the first bit stream;
    generating a second bit stream from the first bit stream, the second bit stream having one or more different corresponding bit values than the first bit stream;
    encoding the second bit steam with a second encoder to generate a second encoder first bit and a second encoder second bit for each bit in the second bit steam; and
    multiplexing the first bit stream, the first encoder first bit, the first encoder second bit, the second encoder first bit, and the second encoder second bit, wherein the step of generating a second bit steam comprises at least one of a ones complementer and a differential encoder.

4. A method for encoding a first bit stream, comprising:
receiving the first bit stream;
encoding the first bit stream with a first encoder to generate a first encoder first bit and a first encoder second bit for each bit in the first bit stream;
generating a second bit stream from the first bit stream, the second bit stream having one or more different corresponding bit values than the first bit stream;
generating an interleaved bit stream from the second bit stream;
encoding the interleaved bit stream to generate a second encoder first bit and a second encoder second bit for each bit in the interleaved bit stream; and
multiplexing the first bit stream, the first encoder first bit, the first encoder second bit, the second encoder first bit, and the second encoder second bit.

5. The method of claim 4, wherein the step of encoding the first bit stream further comprises utilizing a constitute encoder to generate a first encoder first bit and a first encoder second bit.

6. The method of claim 4, wherein the step of encoding the interleaved bit stream further comprises utilizing a constitute encoder to generate a second encoder first bit and a second encoder second bit.

7. The method of claim 4, wherein the step of generating a second bit stream comprises at least one of a ones complementer and a differential encoder.

8. A decoder for decoding a first bit stream of received bits, comprising:
first decoding means for convening a stream of first decoder first bits, a stream of first decoder second bits, the first bit stream, and a second stream of probability values that the corresponding received bit is a one from an early iteration, to a first stream of probability values that the corresponding received bit is a one;
first sign inverting means for inverting the signs of the first stream of probability values; means for generating a second bit stream from the first bit stream, the second bit stream having one or more different corresponding bit values than the first bit stream;
second decoding means for converting the first stream of probability values, the second bit stream, a stream of second decoder first bits, and a stream of second decoder second bits, to a second stream of probability values that the corresponding bit of the second bit stream is a zero; and
second sign inverting means for inverting the signs of the second stream of probability values.

9. The decoder of claim 8, further comprising an interleaver means for reordering at least one of the first bit stream and the second bit stream.

10. The decoder of claim 8, wherein the means for generating a second bit stream comprises at least one of a ones complementer and a differential encoder.

11. A decoder for decoding a first bit stream of received bits, comprising:
first decoding means for converting a stream of first decoder first bits, a stream of first decoder second bits, the first bit stream, and a second stream of probability values that a corresponding received bit is a one from an early iteration, to a first stream of probability values that the corresponding received bit is a one;
first decoder interleaver means for reordering the stream of probability values to the order required by a second decoder;
first sign inverting means for inverting the signs of the first stream of probability values;
second decoder interleaver means for reordering the stream of received bits to the order required by the second decoder;
means for generating a second bit stream of the reordered bits, the second bit stream having one or more different corresponding bit values than the reordered bits produced by the second decoder interleaver means;
second decoding means for converting the first stream of probability values, the second bit stream, a stream of second decoder first bits, and a stream of second decoder second bits, to a second stream of probability values that the corresponding bit of the second bit stream is a one;
de-interleaver means for reordering the second stream of probability values for reordering the second stream of probability values to the order required by the first decoder; second sign inverting means for inverting the signs of the second stream of probability values; and
decision unit means for allowing one or more iterations of determining the second stream of probability values.

12. The decoder of claim 11, wherein the means for generating a second bit stream comprises at least one of a ones complementer and a differential encoder.

13. A method for decoding a first bit stream of received bits, comprising:
converting a stream of first decoder first bits, a stream of first decoder second bits, the first bit stream, and a second stream of probability values from an early iteration, to a first stream of probability values that the corresponding bit of the first bit stream is a one;
inverting the signs of the first stream of probability values;
generating a second bit stream from the first bit stream, the second bit stream having one or more different corresponding bit values than the first bit steam;
converting the first stream of probability values, the second bit stream, a stream of second decoder first bits, and a steam of second decoder second bits, to a second stream of probability values that the corresponding bit of the second bit stream is a zero;
inverting the signs of the second stream of probability values; and
repeating the above steps a specified number of iterations.

14. The method of claim 13, further comprising interleaving at least one of the first bit stream and the second bit stream.

15. The method of claim 13, wherein the step of generating a second bit stream comprises at least one of a ones complementer and a differential encoder.

16. A method of decoding a first bit stream of received bits, comprising:
convening a stream of first decoder first bits, a stream of first decoder second bits, the first bit stream, and a second stream of probability values that the corresponding received bit is a one from an early iteration, to a first stream of probability values that the corresponding bit in the first bit stream is a one;
reordering the first stream of probability values to the order required by a second decoder; inverting the signs of the first stream of probability values;
interleaving the first bit stream of received bits to the order required by the second decoder, creating a reordered bit stream;
generating a second bit stream of the reordered bits, the second bit stream having one or more different corresponding bit values than the first bit stream;

converting the first stream of probability values, the second bit stream, a stream of second decoder first bits, and a stream of second decoder second bits, to a second stream of probability values that the corresponding bit of the ones complement bit stream is a zero;

de-interleaving the second stream of probability values for reordering the second stream of probability values to the order required by the first decoder;

inverting the signs of the second stream of probability values; and repeating the above steps a specified number of iterations.

17. The method of claim 16, wherein the step of generating a second bit stream comprises at least one of a ones complementer and a differential encoder.

18. An apparatus comprising an encoder for encoding a first bit stream, comprising:

means for generating a second bit stream from the first bit stream, the second bit stream having one or more different corresponding bit values than the first bit stream;

means for encoding a first encoder first bit and a first encoder second bit for each bit in the first bit stream; and means for encoding a second encoder first bit and a second encoder second bit for each bit in the second bit stream, wherein the means for generating a second bit stream comprises at least one of a ones complementer and a differential encoder.

19. An apparatus comprising an encoder for encoding a first bit stream, comprising:

means for generating a fast encoder first bit and a first encoder second bit for each bit in the first bit stream;

means for generating a second bit stream from the first bit stream, the second bit stream having one or more different corresponding bit values than the first bit stream;

means for generating a second encoder first bit and a second encoder second bit for each bit in the second bit stream; and means for multiplexing die first bit stream, the first encoder first bit, the first encoder second bit, the second encoder first bit, and the second encoder second bit, wherein the means for generating a second bit stream comprises at least one of a ones complementer and a differential encoder.

20. An apparatus comprising a decoder for decoding a first bit stream of received bits, comprising:

first decoding means for converting a stream of first decoder first bits, a stream of first decoder second bits, the first bit stream, and a second stream of probability values that the corresponding received bit is a one from an early iteration, to a first stream of probability values that the corresponding received bit is a one;

first sign inverting means for inverting the signs of the first stream of probability values;

means for generating a second bit stream from the first bit stream, the second bit stream having one or more different corresponding bit values than the first bit stream;

second decoding means for convening the first stream of probability values, the second bit stream, a second decoder first bit, arid a second decoder second bit, to a second stream of probability values that the corresponding bit of the second bit stream is a zero; and second sign inverting means for inverting the signs of the second stream of probability values.

21. A module comprising a decoder for decoding a first bit stream of received bits, comprising:

first decoding means for converting a stream of first decoder first bits, a stream of first decoder second bits, the first bit stream, and a second stream of probability values that the corresponding received bit is a one from an early iteration, to a first stream of probability values that the corresponding received bit is a one;

first sign inverting means for inverting the signs of the first steam of probability values;

means for generating a second bit stream from the first bit stream, the second bit stream having one or more different corresponding bit values than the first bit stream;

second decoder means for converting the first stream of probability values, the second bit stream, a second decoder first bit, and a second decoder second bit, to a second stream of probability values that the corresponding bit of the second bit stream is a zero; and second sign inverting means for inverting the signs of the second stream of probability values.

* * * * *